(12) United States Patent
Zhu et al.

(10) Patent No.: US 7,504,700 B2
(45) Date of Patent: Mar. 17, 2009

(54) METHOD OF FORMING AN ULTRA-THIN [[HFSIO]] METAL SILICATE FILM FOR HIGH PERFORMANCE CMOS APPLICATIONS AND SEMICONDUCTOR STRUCTURE FORMED IN SAID METHOD

(75) Inventors: Wenjuan Zhu, Carmel, NY (US); Michael P. Chudzik, Danbury, CT (US); Oleg Gluschenkov, Poughkeepsie, NY (US); Dae-Gyu Park, Wappingers Falls, NY (US); Akihisa Sekiguchi, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/907,935

(22) Filed: Apr. 21, 2005

(65) Prior Publication Data

US 2006/0237803 A1    Oct. 26, 2006

(51) Int. Cl.
*H01L 27/088* (2006.01)
*H01L 21/3205* (2006.01)
*H01L 21/4763* (2006.01)

(52) U.S. Cl. .................. 257/410; 438/591; 438/287

(58) Field of Classification Search .............. 438/201, 438/197, 592, 301, 597, 591, 287; 257/216, 257/410, 347
See application file for complete search history.

(56) References Cited

U.S. PATENT DOCUMENTS

| | | | | |
|---|---|---|---|---|
| 6,004,850 | A * | 12/1999 | Lucas et al. | 438/301 |
| 6,172,407 | B1 * | 1/2001 | Gardner et al. | 257/410 |
| 6,184,072 | B1 * | 2/2001 | Kaushik et al. | 438/197 |
| 6,194,748 | B1 * | 2/2001 | Yu | 257/216 |
| 6,342,414 | B1 * | 1/2002 | Xiang et al. | 438/201 |
| 6,376,349 | B1 * | 4/2002 | Tobin et al. | 438/592 |
| 6,420,279 | B1 | 7/2002 | Ono et al. | |
| 6,475,874 | B2 | 11/2002 | Xiang et al. | |
| 6,504,214 | B1 * | 1/2003 | Yu et al. | 257/347 |
| 6,518,156 | B1 * | 2/2003 | Chen et al. | 438/597 |
| 6,562,718 | B1 | 5/2003 | Xiang et al. | |
| 6,624,093 | B1 | 9/2003 | Lyman et al. | |
| 6,638,876 | B2 | 10/2003 | Levy et al. | |
| 2005/0224897 | A1 * | 10/2005 | Chen et al. | 257/410 |

\* cited by examiner

*Primary Examiner*—Evan Pert
*Assistant Examiner*—Monica D Harrison
(74) *Attorney, Agent, or Firm*—Scully, Scott, Murphy & Presser, P.C.; Yuanmin Cai

(57) ABSTRACT

A semiconductor structure and method of forming the same, comprising forming a uniform buffer layer of diffusion-controlling stable material on top of a base gate dielectric layer, and then forming a uniform layer which contains a source of transitional metal atoms, and then annealing the structure to diffuse the transitional metal atoms from their source through the diffusion-controlling material and into the base gate dielectric layer.

20 Claims, 8 Drawing Sheets

METHOD OF FORMING AN ULTRA-THIN [[HFSIO]] METAL SILICATE FILM FOR HIGH PERFORMANCE CMOS APPLICATIONS AND SEMICONDUCTOR STRUCTURE FORMED IN SAID METHOD

FIELD OF THE INVENTION

The present invention generally relates to semiconductor devices, and more particularly to complementary metal oxide semiconductor field effect transistor (MOSFET) structures that include a gate stack having an ultra-thin, high-k gate dielectric layer that increases performance of CMOS devices. The present invention also relates to a method of fabricating such MOSFET gate structures having an ultra-thin, high-k gate dielectric layer.

BACKGROUND OF THE INVENTION

For a high performance CMOS device, the inversion capacitance-based oxide-equivalent thickness of the gate dielectrics (Tinv) needs to be scaled down below 16 Å for future technologies. Traditional oxynitride as a gate dielectric material is reaching its technological limits.

In future technology generations, it is highly desirable to replace a silicon dioxide or silicon oxynitride dielectric with a gate material that has a higher dielectric constant. These materials are known as "high k" materials with the term "high k" denoting an insulating material whose dielectric constant is greater than 4.0, preferably greater than about 7.0. The dielectric constants mentioned herein are relative to a vacuum unless otherwise specified. Of the various possibilities, transitional metal oxides, silicates, or oxynitrides such as hafnium oxide, hafnium silicate, or hafnium silicon oxynitride may be the most suitable replacement candidates for conventional gate dielectrics due to their high dielectric constant and relatively low electrical leakage. In addition, Hf-based compounds exhibit a superior thermal stability at high temperatures with respect to other transitional-metal-based insulating compounds and, therefore, are highly preferred. However, high-k gate dielectric materials and related gate structures should simultaneously possess a number of properties to be useful for state-of-the-art MOSFET devices. Suitable combination of these properties is difficult to achieve with known high-k materials, conventional gate structures, and conventional methods of manufacture.

First, as alluded to above, the suitable high-k containing gate dielectric should be "electrically thin" when the gate is biased in inversion creating a large surface density of mobile inversion charge in the transistor channel. The term "electrically thin" denotes a high capacitance per unit area. It is customary to express the inversion capacitance per unit area in terms of equivalent oxide thickness, Tinv. For the purpose of this invention, Tinv is equal to the absolute dielectric constant of silicon dioxide (~0.345 pF/cm) divided by the measured value of capacitance per unit area in inversion. For instance, a capacitance per unit area in inversion of about 2.16e–6 F/cm$^2$ corresponds to the Tinv of about 16 Å. In turn, the gate dielectric capacitance in inversion consists of several parts including the capacitance of dielectric material itself, the so-called quantum mechanical capacitance associated with a finite size of mobile carrier wave function, and the so-called depletion capacitance of adjacent gate electrode. The inversion capacitance breakdown of Tinv for a state-of-the-art MOSFET is as follows: about 3-5 A for the quantum mechanical portion, about 2-5 A for the gate electrode depletion portion, and about 12-14 A for the gate dielectric material itself. One skilled in the art would appreciate the fact that in order to achieve Tinv of about 16 A with a high-k containing insulating material with a thickness-average k of about 7, the total physical thickness of such high-k containing insulating film should be less than 20 A.

Second, in "high k" material compounds, a metal-oxygen bond is easily polarizable under an external electric filed yielding a high dielectric constant (high-k). The very same high polarizability of these bonds results in a scattering of channel mobile charges by remote phonons present in the high-k material. As a result, the transistor drive current can be substantially reduced by the presence of high-k materials in the gate insulator. It is also known that the proximity of the high-k film to the transistor channel plays a major role in the amount of such highly undesirable remote phonon scattering. The closer the high-k material is to the channel, the stronger the remote phonon scattering. Accordingly, it is extremely difficult to achieve an ultra-thin high-k-containing gate insulator that does not degrade the carrier mobility in the transistor channel.

Third, the entire gate structure including the MOSFET channel region, gate dielectric, and gate electrode should be able to support a state-of-the-art CMOS technology with a low transistor threshold voltage from about 0.1V to about 0.4V. While a desirable threshold voltage can be achieved by varying channel doping and selecting a correct work-function of the gate electrode, it can be inadvertently altered by the presence of a large fixed and/or trapped charge at both gate dielectric interfaces and within the dielectric itself. Further, the density of trapped and/or fixed charge can be inadvertently altered by various processes such as exposure to high-temperature (e.g. a 1000 C. junction activation anneal) or during FET operation. In addition, a high density of fixed or trapped charges in the vicinity of transistor channel can lead to an excessive coulomb scattering of the channel carriers and can reduce the channel mobility and transistor drive current. Accordingly, it is highly desirable to minimize the total surface density of such fixed and/or trapped charge to prevent any undesirable shifts in threshold voltage and channel mobility. Typically, the total surface density of fixed and/or trapped charge should be below 8e–7 C.·cm$^{-2}$ or, equivalently, the surface number density of charged sites should be below about 5e12 cm$^{-2}$ for a single charged site. A charge density of 8e–7 C.·cm$^{-2}$ shifts the threshold voltage by about 0.4V for a gate dielectric with capacitance per unit area in inversion of about 2e–6 F·cm$^{-2}$.

For example, FIG. 1(a) illustrates a conventional approach for fabricating a high-k gate stack 10 where Si substrate 12 has a base oxide layer 14 comprising SiO$_2$ (or a silicon oxynitride—SiON), for example, and a Hf-silicate layer (e.g., Hf$_x$Si$_{1-x}$O$_2$) 16 formed on the base oxide. Typically, the Hf$_x$Si$_{1-x}$O$_2$ layer is deposited by a chemical vapor deposition (CVD) process, and more specifically, by either an Atomic Layer Deposition (ALD) CVD process or Metal-Organic CVD (MOCVD) process, or like deposition methods. Due to the nucleation problem of either of the aforementioned CVD methods, the HfSiO$_2$ film becomes discontinuous at region 20, when the film is thinner than about 20 Å, as shown in the TEM photograph provided in FIG. 2. As a result, leakage current increases dramatically as the high-K film is thinned. Further, the highly non-uniform or discontinuous high-k film modulates the electrochemical potential in the transistor channel, and hence, reduces the transistor current. Thus, poor thickness scalability of high-k films results from conventional methods such as the kind illustrated in FIG. 1. Further, a 15-20 Å-thick base oxide film 14 is clearly visible in FIG. 2. The base oxide dielectric constant is not high (between 3.9 and about 6) resulting in an additional 10-15 Å of Tinv. As a result, typical Tinv of the insulating stack 14/16 with a continuous 20 Å-thick $HfSiO_2$ film has the following components: dielectric material 14-20 Å, quantum-mechanical 3-5 Å, and depletion of a conventional polysilicon gate electrode 2-5 Å. That is, it is very difficult to scale down a high-k containing insulating layer to meet the requirement of high performance devices (e.g. Tinv<=16.5 A).

FIG. 3 depicts a graphic diagram plotting Tinv vs. a leakage current metric (Toxgl) for the $HfO_2$ stack. For the purpose of this invention, Toxgl is a physical thickness of pure silicon oxide layer that yields the same leakage current density at the same inversion bias as the measured leakage current density of the sample under test in inversion bias. The conversion of measured leakage current density into the Toxgl metric is typically calibrated for thicker silicon oxide films and then extrapolated for ultra thin films using well-known direct tunneling laws of physics. As shown in FIG. 3, when the physical thickness of the $HfO_2$ is reduced from 20 Å to 15 Å, the leakage current density increases by about 1 to 2 orders of magnitude (as reflected in Toxgl reduced from 2.3 nm to 2.1 nm), while Tinv is nearly unchanged. If the base oxide were thinned down, the channel electron mobility will reduce significantly as shown in FIG. 4, due to the remote phonon scattering and coulomb scattering. For example, a dielectric gate stack 14/16 with a 7-10 Å-thick base oxide film 14 followed by a 25-30 Å-thick $HfO_2$ film 16 results in a reduction of peak channel mobility by more than 50% as shown in FIG. 4. The mobility degradation for thinner high-k containing dielectrics is another fundamental challenge for conventional gate dielectric structures and methods of manufacture.

Furthermore, in another conventional approach for fabricating a high-k gate stack structure 25 as illustrated in FIG. 1(b), a Si substrate 12 includes a layer of $Hf_xSi_{1-x}O_2$ 24 deposited directly thereon without a base oxide (e.g., $SiO_2$ or oxynitride). The structure 25 depicted in FIG. 1(b) further exhibits a high density of interface traps, low mobility and poor thermal stability. If heated above about 500 C., the $Hf_xSi_{1-x}O_2$ layer 24 reacts with underlying substrate 12 to form a thick layer of base oxide (10 Å-15 Å) yielding final gate dielectric structure similar to that of FIG. 1(a). Accordingly, the structure illustrated in FIG. 1(b) has the same fundamental challenges as that of the structure illustrated in FIG. 1(a).

U.S. Pat. No. 6,624,093 (the '093 Patent) entitled METHOD OF PRODUCING HIGH DIELECTRIC INSULATOR FOR INTEGRATED CIRCUIT proposes a method of forming hafnium silicate by depositing hafnium on a silicon dioxide surface of a silicon wafer and then heating the wafer to produce hafnium silicate. The resulting structure includes a high-k layer only and includes a method step of depositing a metal Hf directly on an $SiO_2$ layer. The benefit of this structure is only in the provision of the high-k dielectric due to high dielectric constant without attendant reduction in Tinv to below 16 Å. Furthermore, the '093 Patent does not teach any solution to the degraded channel mobility in the case of thin high-k containing dielectrics with Tinv<16 Å. Subsequently, methods taught in the '093 Patent are only useful for forming relatively thick high-k containing gate dielectrics that do not suffer much from the mobility degradation effects.

U.S. Pat. No. 6,342,414 (the '414 Patent) and U.S. Pat. No. 6,475,874 (the '874 patent) both entitled DAMASCENE NiSi METAL GATE HIGH-K TRANSISTOR propose a method of forming metal silicide gate by confining a low temperature silicidation metal within a recess which is overlaying on the channel. In the recess area, the high-k dielectric is deposited first. Then, a fully-silicided (FUSI) gate layer is formed by depositing a silicon layer on metal layer and then annealing (in the '414 Patent) or, a FUSI layer is formed by depositing a metal layer on silicon layer and then annealing (in the '874 Patent). In these references, the high-k layer and FUSI are formed in two separate steps. High-k is deposited in advance. Then, Si and metal (or vice versa) are deposited and annealed to form the FUSI. The structure and method disclosed in this patent does not solve the aforementioned high-k scaling problems even though, generally, silicide-based, metal-based, and metallic compound-based (e.g. conductive metal nitrides, borides, carbides, oxides, etc.) gate electrodes result in the reduction or elimination of the depletion portion of Tinv. Since high-k dielectric is deposited by a regular method (either PVD or CVD), the physical thickness of the high-k film made by these methods is limited to about 20 Å in addition to 15-20 Å of the SiON base layer needed for acceptable channel mobility as discussed above. As a result, the Tinv of such conventional high-k containing dielectric and FUSI gate electrode is above about 20 Å. Alternatively, the channel mobility is substantially degraded for base SiON layers thinner than about 15 Å and overall Tinv thinner than about 18 Å. While there are numerous instances of prior art teachings where conventional high-k containing films are employed as gate dielectrics in combination with metal gate structures, the resultant transistor gate structures suffer from the same drawbacks as in the '414 Patent and the '874 Patent. Accordingly, it would be highly desirable to enable physical scaling of the high-k containing gate dielectric layer into the 10 Å-20 Å regime without any substantial mobility degradation.

Related co-pending U.S. patent application Ser. No. 10/869,658 (the '658 Patent Application), assigned to the assignee hereof and incorporated herein by reference in its entirety, entitled "High-temperature stable gate structure with metallic electrode" teaches the use of an ultra thin layer of reactive transitional metal such as titanium on top of the slightly thickened base oxide in the range of from about 13 Å to about 20 Å. During a high temperature step, the reactive metal reacts with the base oxide in a non-oxidizing ambient yielding an ultra thin layer of high-k material. In order to make the resultant high-k film thin and insulating, the application teaches that the metal layer should be as thin as possible but still uniform. This can be accomplished if the metal film is thicker than one monolayer and is deposited by a technique that does not have any nucleation problems in such thin regime. Unfortunately, PVD (physical vapor deposition or sputtering) deposition technique employed in the '658 Patent Application results in damage to the base oxide film by energetic ions. In addition, the method is limited to highly reactive titanium atoms which are known to react with silicon oxide at a relatively low temperature of below about 700 C.

Therefore, a new solution is needed to solve the aforementioned problems with the prior art conventional approaches.

SUMMARY OF THE INVENTION

The present invention provides a CMOS gate structure that uniformly incorporates a low dose of transitional metal atoms such as Hf, Ti, Zr, or La of below about 7e14 atoms/$cm^2$ or less than a corresponding dose of a continuous metallic film into otherwise thin and uniform layer of oxynitride gate dielectric (9-20 Å in physical thickness) and allows for high mobility of channel carriers (electrons or holes), low density of trapped and fixed charges while providing scaling of Tinv to about or below 16 Å for a conventional polysilicon gate electrode and to about or below 14 Å for a metallic-based gate electrode.

The present invention achieves the above-mentioned advantage by providing a method of fabricating a semiconductor structure by first forming a layer of diffusion-controlling buffer layer on top of a base gate layer oxide, then forming a source of metallic atoms such as Hf, Ti, Zr, or La and annealing the stack to form an ultra thin metal oxide layer with gradual metal concentration (high metal "M" concentration at an upper region and low at a lower region). By doing this, the nucleation problem of CVD $M_xSi_{1-x}O_2$ is avoided, and thus, an ultra-thin $M_xSi_{1-x}O_2$ stack is achievable. As the metal concentration is high at an upper region and low at a lower region, low interface trap density, high mobility, and good thermal stability is achieved, while maintaining the high dielectric constant of the stack. In an alternate method, a thin layer of metal M is formed on top of a poly Silicon layer, and, in a single anneal step, forms a (FUSI) MSi and the $M_xSi_{1-x}O_2$ layer. The FUSI gate results in a reduction of Tinv. A very thin $M_xSi_{1-x}O_2$ layer is formed further reducing Tinv. Additionally, higher mobility results while maintaining high average dielectric constant.

According to a first embodiment of the invention, there is provided a semiconductor structure and method comprising the steps of:

a) providing a semiconductor substrate;

b) forming a layer of dielectric material upon the semiconductor substrate;

c) forming a diffusion-controlling buffer layer atop of the dielectric material;

d) forming a layer of metal-containing material atop the buffer layer to form a stack; and, e) annealing the stack to diffuse metal atoms from the metal-containing material through the buffer layer into the dielectric layer to form a high k gate dielectric layer atop the substrate, the high k gate dielectric layer having a higher metal concentration toward an upper region of the high k gate dielectric layer and a lower metal concentration toward a lower region of the high k gate dielectric layer.

According to the invention, the high k gate dielectric layer comprises a metal oxide of the form $M_xSi_{1-x}O_2$, with x ranging between 0 and 0.3

According to the invention, the high k gate dielectric layer comprises a total dose of metal atoms of below 7e14 cm−2 and, preferably, in the range of from about 3e13 cm$^{-2}$ to about 5e14 cm$^{-2}$ with the range of from about 5e13 cm$^{-2}$ to about 4e14 cm$^{-2}$ being more highly preferred.

The gate electrode material is advantageously selected to enable low-threshold-voltage CMOS circuits. In a first embodiment, the source of metal atoms and the buffer layer are selectively removed after anneal and then a gate electrode material is formed on the gate dielectric to have threshold voltages of NFET and PFET of from about 0.1V to about 0.4V.

According to a second embodiment, only the source of metal atoms is selectively removed after the anneal step, while the buffer layer is kept as the gate electrode. In this embodiment, the buffer layer is selected to yield a correct work function of the resultant gate electrode.

According to a third embodiment, the buffer layer and the metal atom source are advantageously selected in such a way that their combined structure after the anneal step is suitable for being a CMOS gate electrode. In one example, the buffer layer is a silicon-containing layer such as polysilicon (Poly Si).

Advantageously, CMOS devices formed according to the methods of the present invention have the benefit of further Tinv scaling and device performance enhancement due to the ultra-thin high-k layer and FUSI formed.

DETAILED DESCRIPTION OF THE INVENTION

Figure 1A:
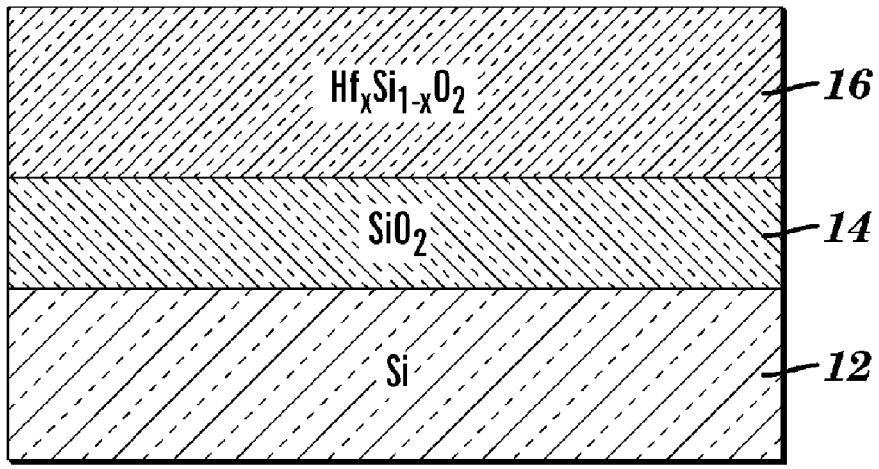
FIGS. 1(a) and 1(b) are schematic diagrams depicting conventional approaches for fabricating a high-k gate stack.
Figure 1B:
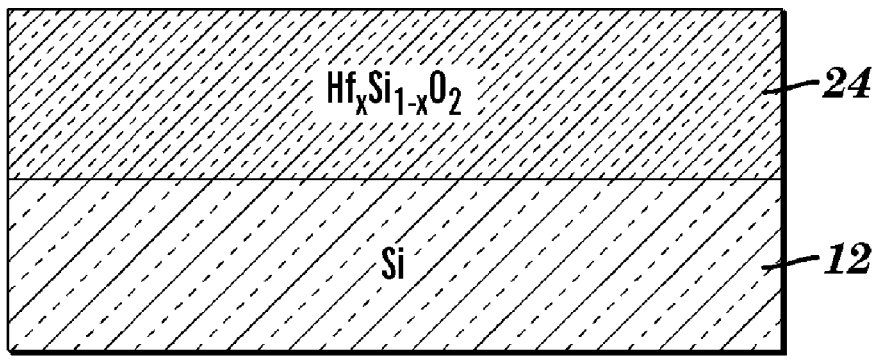
Figure 2:
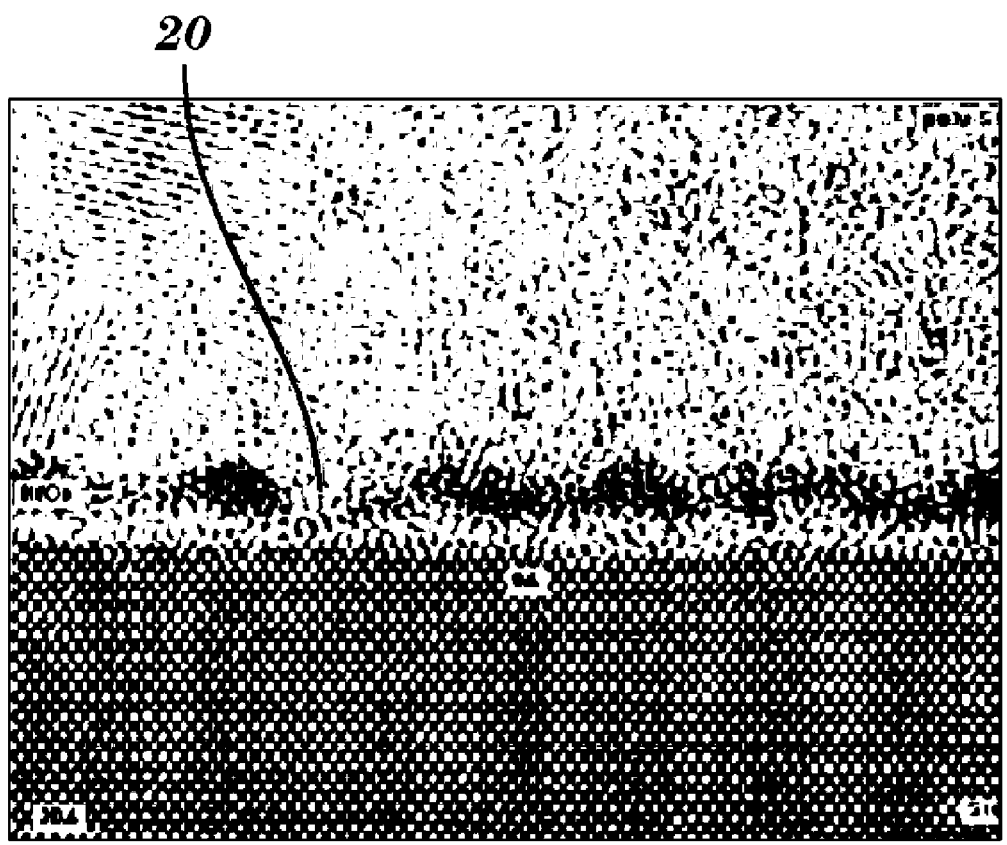
FIG. 2 is a TEM photograph depicting, through a cross sectional view, a $HfSiO_2$ thin film stack showing a discontinuity resulting from a CVD process nucleation problem.
Figure 3:
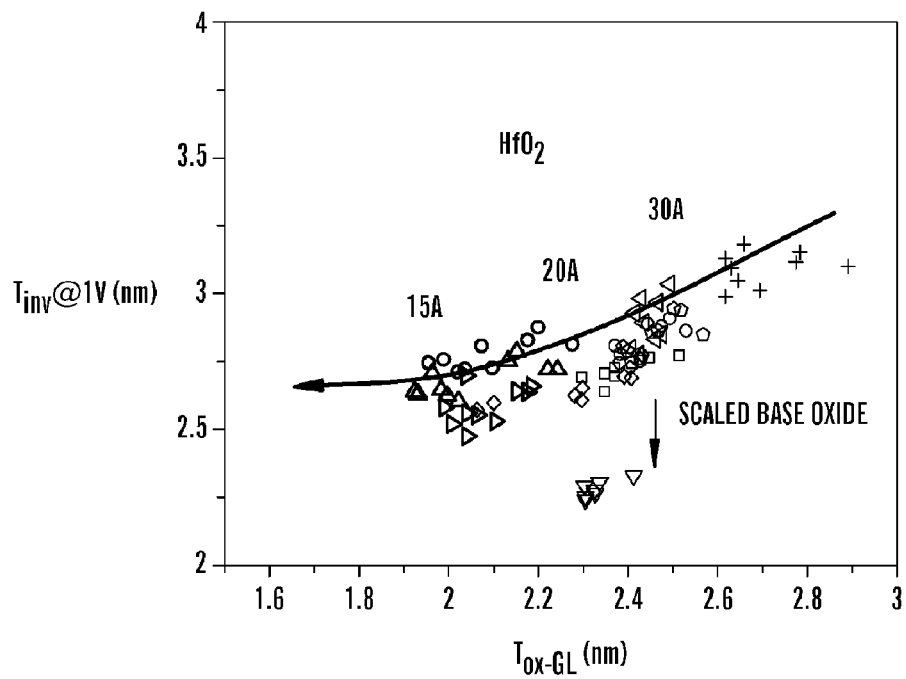
FIG. 3 depicts a graphic diagram plotting Tinv vs. Toxgl for an $HfO_2$ stack and illustrating the increase in leakage current density for the prior art device depicted in FIGS. 1(a) and 1(b)
Figure 4:
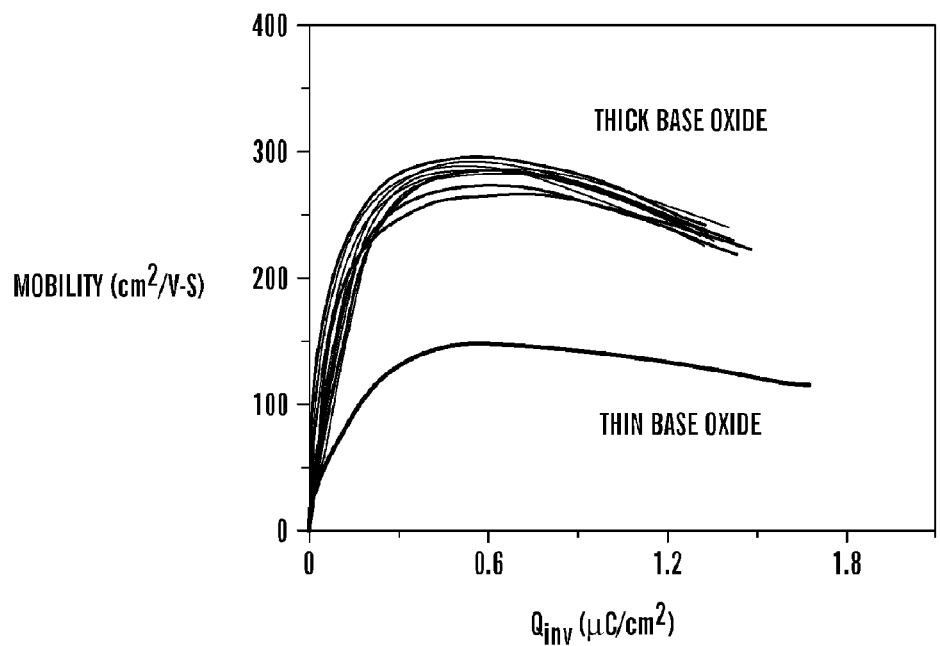
FIG. 4 depicts a graphic diagram illustrating the reduction of channel electron mobility when the base oxide layer depicted in the prior art stack of FIG. 1(a) is thinned.
Figure 5:
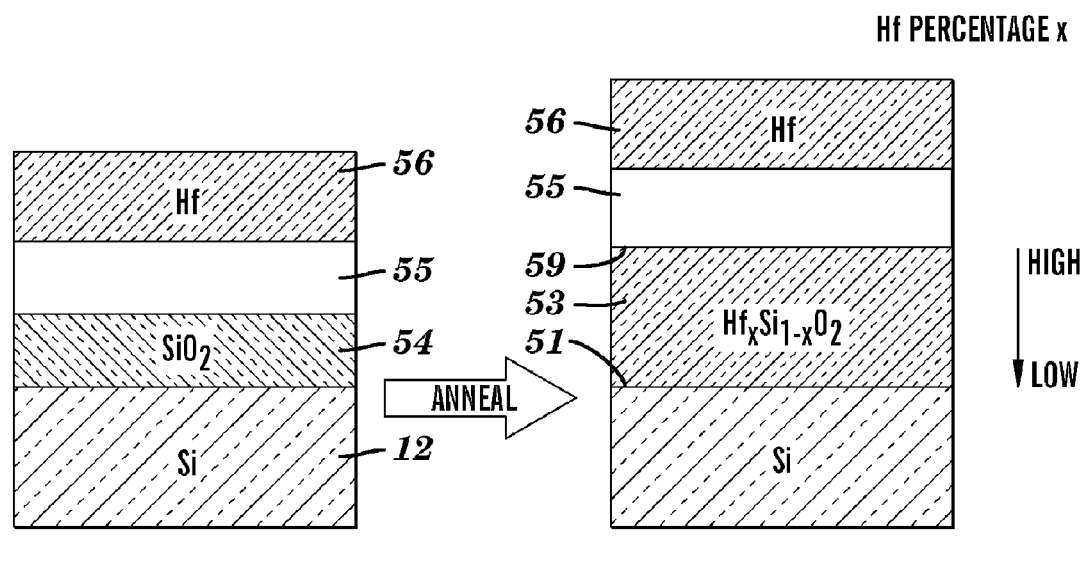
FIG. 5 illustrates an exemplary method of forming a gate dielectric layer through diffusion of transition metal atoms through a buffer layer.

Referring to FIG. 5, the advantages of the present invention are achieved by first forming a uniform buffer layer 55 of diffusion-controlling stable material such as amorphous silicon or germanium on top of a base gate dielectric layer 54, e.g., a silicon oxynitride, and then forming a uniform layer 56 which contains a source of transitional metal atoms such as a layer of pure Hf, Ti, Zr, or La and then annealing the structure to diffuse the transitional metal atoms from their source through the diffusion-controlling material and into the base gate dielectric layer.

One skilled in the art would appreciate the fact that the resultant dose of transitional metal atoms in the base gate dielectric is mostly controlled by the diffusion and/or reaction property of the diffusion-controlling layer and conditions (temperature and time) of the annealing step, and, to a much lesser extent, by the characteristics of metal atom source. Hence, the instant invention effectively decouples the control of the metal atom dose in a high-k gate dielectric layer from the characteristics of conventional metal-containing layers and respective methods of forming such layers. In addition, the ability of controlling diffusion process and the resultant metal dose in the gate dielectric by two independent features (the diffusion-controlling layer and the anneal step) allows for selecting a wide range of anneal temperatures while maintaining a desirable (low) dose of metal atoms in the gate dielectric film. This flexibility is employed in selecting certain (high) anneal temperature(s) needed for promoting metal atom incorporation into and chemical bonding with the atomic structure of base gate dielectric.

One novel feature of the resultant gate dielectric structure of the present invention is that a very low dose of metal atoms can be uniformly incorporated into a physically thin gate dielectric. Specifically, the total surface density or dose of metal atoms in the gate dielectric can be beneficially made smaller than approximately 7e14 cm$^{-2}$ and preferably in the range of approximately 3e13 cm$^{-2}$ to 5e14 cm$^{-2}$ with the range of approximately 5e13 cm$^{-2}$ to 4e14 cm$^{-2}$ being more highly preferred. The resultant gate dielectric physical thickness can be maintained from approximately 9 Å to 20 Å, and preferably from approximately 12 Å to 17 Å. The total dose of transitional metal atoms in known continuous high-k gate dielectric structures is substantially higher because the source of metal atoms is directly deposited onto the base gate dielectric or substrate and, consequently, equals the surface density or dose of metals atoms in a uniform continuous film. By way of example, the dose of Hf in a continuous metallic layer of one-two-monolayer-thick is above about 1e15 cm$^{-2}$. In an alternative example, the dose of Hf atoms in a continuous 20 Å-thick $Hf_{0.2}Si_{0.8}O_2$ film is similarly above about 1e15 cm$^{-2}$. Having a low dose of metal atoms in the thin gate dielectric reduces the remote phonon scattering and, subsequently, reduces highly undesirable channel mobility degradation. Nevertheless, the preferred low dose of metal atoms coupled with the preferred range of physical thickness of resultant gate dielectric provides a measurable boost enabling Tinv scaling to below 16 Å (for conventional polysilicon gate electrode) at a constant (or lower) gate leakage.

Another feature of the resultant gate dielectric structure of the present invention is that the concentration of metallic atoms inside the gate dielectric in the direction perpendicular to the transistor channel is advantageously graded with a lower concentration being near the channel and higher concentration being away from the channel. Such grading further reduces the mobility degradation and any inadvertent introduction of electrical traps and fixed charges in the vicinity of the channel. The graded profile is a result of introducing metal atoms into the gate dielectric by a controlled diffusion process.

The gate electrode completes the CMOS gate structure of the present invention. Formation of gate electrode can be accomplished in several different ways. In the first set of embodiments, either the source of metal atoms or the diffusion-controlling layer or both are selectively removed after the anneal step without damaging the gate dielectric and, then, a different gate electrode(s) is/are formed by conventional processes. In the second set of embodiments, the diffusion-controlling layer and the metal atom source are advantageously selected in such a way that their combined structure after the anneal step is suitable for use as a CMOS gate electrode.

Various novel aspects and advantages of the inventive structure will be more apparent from the following detailed description.

Referring to FIGS. 5-8, the semiconductor substrate 12 employed in the present invention comprises any semiconductor material including, but not limited to: Si, Ge, SiGe, SiC, SiGeC, Ga, GaAs, InAs, InP and all other III/V or II/VI compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein, or further, may be strained, unstrained or any combination thereof. The substrate 12 may include various useful structures such as isolation trenches, various doping wells, trench-based memory cells, etc. These structures are typically present in the substrate 12 at this step but are not essential to the instant invention, and hence, are not shown. Moreover, the semiconductor substrate 12 may include surfaces with any crystallographic orientation including, for example, (100), (110), (111) or any suitable combination thereof.

Prior to forming the base dielectric 54, the surface of substrate 12 is cleaned to remove any residual layers (e.g. native oxide), foreign particles, and any residual metallic surface contamination and to temporarily protect the cleaned substrate surface. The residual silicon oxide is first removed in a solution of hydrofluoric acid. The preferred removal of particles and residual metallic contamination is based on the industry standard gate dielectric preclean known as RCA. It contains a treatment of the substrate 12 in a solution of ammonium hydroxide (NH4OH) and hydrogen peroxide (H2O2) followed by an aqueous mixture of hydrochloric acid and oxidizing agent (e.g. H2O2, O3). As a result, the cleaned substrate surface is sealed with a very thin layer of chemical oxide. While the protective chemical oxide is typically made thinner than about 10 Å so to not interfere with the properties of base dielectric layer 54, its thickness can be varied to beneficially alter properties of the base dielectric layer 54.

The base dielectric 54 can be formed by a thermal growth process such as, for example, oxidation, nitridation or oxynitridation. For example, the thin base dielectric can be formed by thermal oxidation in an oxidizing ambient such as low-partial-pressure molecular oxygen O2 (partial pressure of from about 10 Torr to about 300 Torr) followed by a thermal nitridation process in a nitridizing ambient such as low-partial-pressure ammonia NH3 (partial pressure of from about 30 mTorr to about 30 Torr). The partial pressure of active species (e.g. O2 and NH3), the process temperature, and the duration of the process are selected to yield a uniform layer of oxynitride base dielectric 54 having a desired chemical composition (namely, oxygen to nitrogen ratio) in a desired physical thickness range of approximately 8 Å to 20 Å. The order of oxidation and nitridation processes is not essential because it only alters selection of the aforementioned parameters for both oxidation and nitridation processes, but nevertheless, allows for forming a base dielectric film 54 in the desired thickness range. The dependence of film growth rate and its chemical composition on the process parameters (also referred to as "the process space") is known in the art for both direct and reverse order process sequences for a number of typical oxidizing and nitridizing chemical agents (e.g. O, O2, O3, NO, N2O, NH3, N2H4, and N). Such "process space" can be readily mapped for any unknown combination of oxidizing and nitridizing agents.

Optionally, the oxidation/nitridation processes can be aided by generating activated metastable atomic or molecular species such as atomic or molecular radicals and/or ions. The activated particles are typically generated with the aid of gaseous discharge, ultraviolet radiation, or intense heat. The activated particles can be generated either in the vicinity of the substrate 12 or remotely. One example of such activated processes is a commercially available plasma nitridation process, where the nitridation step is performed with the aid of nitrogen gaseous discharge that produces atomic nitrogen, molecular and atomic ions, and metastable nitrogen molecules. The activated nitrogen particles participate in the gate dielectric nitridation process.

Alternatively, the base dielectric 54 can be formed by chemical vapor deposition (CVD) and other like deposition processes. Dielectric 54 may also be formed utilizing any combination of the above processes and can be optionally annealed at an elevated temperature of approximately 800 C. to 1150 C. in a neutral ambient.

While there are various ways to form base dielectric layer 54, the range of its preferred properties is as follows. The physical thickness range is approximately 8 Å to 20 Å. The highly preferred chemical composition of layer 54 is approximately 10 atomic percent of nitrogen to 30 atomic percent of nitrogen. For silicon-based substrate 12, a nitrogen content higher than approximately 25 atomic percent leads to an undesirably high amount of fixed/trapped charge. Physical thickness and chemical composition can also be specified as the total surface concentration or dose of oxygen and nitrogen atoms present in the layer 54. Most preferably, layer 54 contains an oxygen dose of approximately 1.5e15 $cm^{-2}$ to 8e15 $cm^{-2}$ and a nitrogen dose of below approximately 2e15 $cm^{-2}$ with an oxygen dose of approximately 2.5e15 $cm^{-2}$ to 5e15 $cm^{-2}$ and a nitrogen dose of approximately 5e14 $cm^{-2}$ to 1.5 $cm^{-2}$ being most preferred. The nitrogen content within film 54 can be advantageously graded with higher nitrogen content being away from the transistor channel.

According to the present invention, as depicted in FIG. 5, the layer 54 is covered with a diffusion-controlling layer 55. Layer 55 is preferably formed by a low-temperature chemical vapor deposition in a non-oxidizing ambient to prevent any undesirable interaction between the deposition process and the base dielectric layer 54. While plasma-assisted processes (e.g. PECVD, PVD) can be used for depositing layer 55, they are undesirable due to potential damage of layer 54 by energetic plasma ions. The material of layer 55 is selected to suit one of two embodiments of the present invention. In the first embodiment, the layer 55 is sacrificial. Accordingly, its material is chosen in such a way so that it can be selectively removed without damaging the underlying gate dielectric layer. In the second embodiment, the material of layer 55 is employed to form a gate electrode. Accordingly, it is selected to have threshold characteristics suitable for CMOS gate structures. In either case, the thickness of layer 55 is selected in accordance with its diffusion and reaction properties with respect to transitional metal atoms such as Hf, Ti, La, or Zr so that the layer functions as a diffusion regulator for these atoms.

In a first embodiment, layer 55 is sacrificial and is selected from the following two groups: inert semiconductors and inert metals. Chemical inertness is specified with respect to the layer 54. For instance, germanium (Ge), a preferred representative of the inert semiconductor group, is a relatively stable material with respect to layer 54 and can be very selectively removed in a solution of hydrogen peroxide. A diffusion-controlling Ge layer can be deposited in commercially available CVD reactors using a GeH4 gaseous precursor. Layer 55 is made thick enough (preferably thicker than approximately 100 Å) to circumvent Ge film islanding in the ultra thin regime due to uneven germanium nucleation on the surface of layer 54.

The preferred inert metals comprise refractory metals and their metallic compounds such as nitrides. These metallic compounds can be selectively removed using a solution of sulfuric acid. Most preferably, the inert metal comprises tungsten (W), molybdenum (Mo), or their respective nitrides. Tungsten or tungsten nitride is preferably deposited using either $W(CO)_6$ or $WF_6$ precursor. $W(CO)_6$ is preferred over $WF_6$ because fluorine can interfere with layer 54. In the case of tungsten nitride, layer 55 can be deposited using an atomic layer deposition (ALD) or, equivalently, a pulsed CVD technique where the delivery of tungsten precursor (e.g. W(CO)6) alternates with the delivery of nitrogen precursor (e.g. NH3). While pulsed CVD or ALD processes generally result in more even nucleation and less film islanding, layer 55 is preferably made thicker than approximately 30-50 Å to avoid any film islanding due to the uneven nucleation.

In a second embodiment, layer 55 is selected to yield a gate electrode having a suitable work function. Layer 55 can comprise various elemental metals and metallic compounds (e.g. silicides, nitrides, borides, and carbides) which are chemically inert to both layer 54 and transitional metal atoms such as Hf, Ti, La, and Zr. In this case, the material of layer 55 is selected similar to that of a metal gate electrode, that is, its Fermi level is aligned with either conduction or valence band of silicon for conventional NFETs and PFETs, respectively. For example, tungsten nitride with high nitrogen content can be employed as a PFET-compatible gate electrode. Accordingly, layer 55 can comprise WN in the case of PFET devices. In another example, tantalum nitride (TaN) can be employed as a NFET-compatible gate electrode. Accordingly, layer 55 can comprise TaN in the case of NFET devices. While there are many alternative materials for both NFET-compatible and PFET-compatible gate electrodes, such alternative materials can be used as constitutes of layer 55 so long as they are substantially inert to layer 54 and transitional metal atoms such as Hf, Ti, La, and Zr.

In a third embodiment, layer 55 is used to form a gate electrode after reaction with layer 56. Layer 55 is selected to yield a correct work function of the resultant gate electrode. For example, layer 55 can comprise silicon such as amorphous or polycrystalline silicon. Silicon-based layer 55 can be deposited in a low pressure CVD (LPCVD) reactor using silane SiH4 as a silicon precursor. In a typical LPCVD reactor, layer 55 can be made as thin as approximately 50 Å without any loss of continuity. Silicon-based layer 55 can be converted into a silicide-based gate electrode yielding a Fermi level close to the middle point of silicon bandgap. The mid-gap gate electrode is particularly useful for transistors having fully depleted bodies known as fully-depleted transistors.

Returning to FIG. 5, a source of transitional metal atoms 56 is then formed on top of layer 55. Layer 56 preferably comprises an elemental metal such as Hf, Ti, La, Zr, or an alloy thereof. The metallic layer can be formed by any known deposition technique such as various types of CVD (e.g. metal-organic CVD, pulsed CVD, etc.), physical vapor deposition (PVD), sputtering, plating, or by means of implanting ions into the top portion of layer 55. Layer 56 is made thick enough to be continuous and uniform. The minimal thickness of layer 56 is dependent upon the particular process used to form the layer. In the case of PVD, layer 56 can be made several monolayers thick (~10 Å) while being continuous and reasonably uniform. An additional advantage of having diffusion-controlling layer 55 is that it protects base dielectric layer 54 from any damage caused by energetic ions present in a PVD reactor. PVD deposition is conducted at a low temperature of below approximately 300 C. The resultant thickness of layer 56 is controlled by process time and electrical biasing of the metal target(s) with respect to the plasma. A particular choice of alloy can be easily introduced in a PVD reactor by using co-sputtering from different targets or by using a target with desired alloy composition. Layer 56 can be made as thick as desired, but in practice, layer 56 need not be thicker than approximately 1000 Å. In the case of CVD, layer 56 can be made approximately 20-50 Å thick to be continuous and reasonably uniform.

Optionally, layer 56 can comprise various compounds of transitional metals such as Hf, Ti, La, and Zr. These compounds can be either conductive such as respective silicides, nitrides, carbides, or borides or can be insulating such as respective oxides and silicates. These compounds should have, or should be able to generate, an access of transitional metal atoms suitable for diffusing at elevated temperatures of approximately 500 C. to 1100 C.

According to the invention and as illustrated in FIG. 5, the stack comprising dielectric layer 54, diffusion-controlling layer 55, and layer 56 is annealed to cause diffusion of transitional metal atoms present in layer 56 through layer 55 and into layer 54. The temperature and duration of anneal are selected to deliver the desired dose range of metals atoms into layer 54. Some of these diffusing atoms can react with the material of layer 55. The presence of such reaction will further reduce the dose of metal atoms delivered into layer 54. Typically, raising anneal temperature yields an exponential increase in the diffusion coefficient of metal atoms in layer 55. The characteristic diffusion length measured in centimeters is proportional to the square root of the diffusion coefficient measured in centimeters squared per second multiplied by the anneal duration measured in seconds. In order to supply a low dose of metal atoms into layer 54 (lower than approximately 7e14 cm−2), the thickness of diffusion-controlling layer 55 should be equal to or smaller than the characteristic diffusion length of metal atoms in layer 55. Due to practical equipment limitations, the anneal temperature range is selected to be between approximately 400 C. to 1150 C. The anneal duration is approximately 1 second to several minutes for commercially available rapid thermal annealers (RTAs) and from about 10 minutes to several hours for typical anneal furnaces. The thickness of layer 55 is then selected in accordance with the aforementioned rule to deliver a desired low dose of transitional metal atoms.

Optionally, the anneal process can be conducted as a multi-step sequence. A multi-step anneal sequence may allow for additional decoupling between the diffusion process through layer 55 and the chemical incorporation process in layer 54. Advantageously, the last anneal step is conducted at a high temperature for very short time to promote chemical reaction within layer 54 without causing excessive diffusion. In one example, the last anneal step is a high-temperature (700 C.-1400 C.) ultra-short anneal (e.g. laser anneal, flash lamp anneal) having a characteristic duration on the order of approximately a millisecond. The high peak temperature of such ultra short anneal helps promote chemical bonding of metal atoms within layer 54 while the ultra short duration causes minimum diffusion and prevents an undesirable excessive penetration of metal atoms into the transistor channel.

In one example, when layer 56 contains Hf atoms and layer 54 contains silicon oxide, the resultant structure comprises ultra-thin $Hf_xSi_{1-x}O_2$ layer 53 with x ranging between 0 and 0.3 and most preferably from 0.03 to 0.1. Additionally, ultra-thin $Hf_xSi_{1-x}O_2$ layer 53 has a gradual Hf concentration within layer 53 (high Hf concentration at upper region 59 and low Hf concentration at lower region 51). Such Hf concentration grading is a result of the diffusion process. The nucleation problem of CVD HfSiO is eliminated when the Hf concentration is graded as previously described, and thus, an ultra-thin HfSiO gate dielectric is achievable. In addition, PVD-induced damage is also eliminated, thus providing Tinv scaling at constant or reduced gate leakage current. More importantly, an ability to controllably deliver a low dose of transitional metal atoms into the gate dielectric substantially reduces the mobility degradation and the amount of trapped/fixed charge while keeping a reasonably high dielectric constant of the gate dielectric. Additionally, as the Hf concentration is high at an upper region and low at a lower region, further reduction in interface trap density, channel scattering is achieved.

Figure 9:
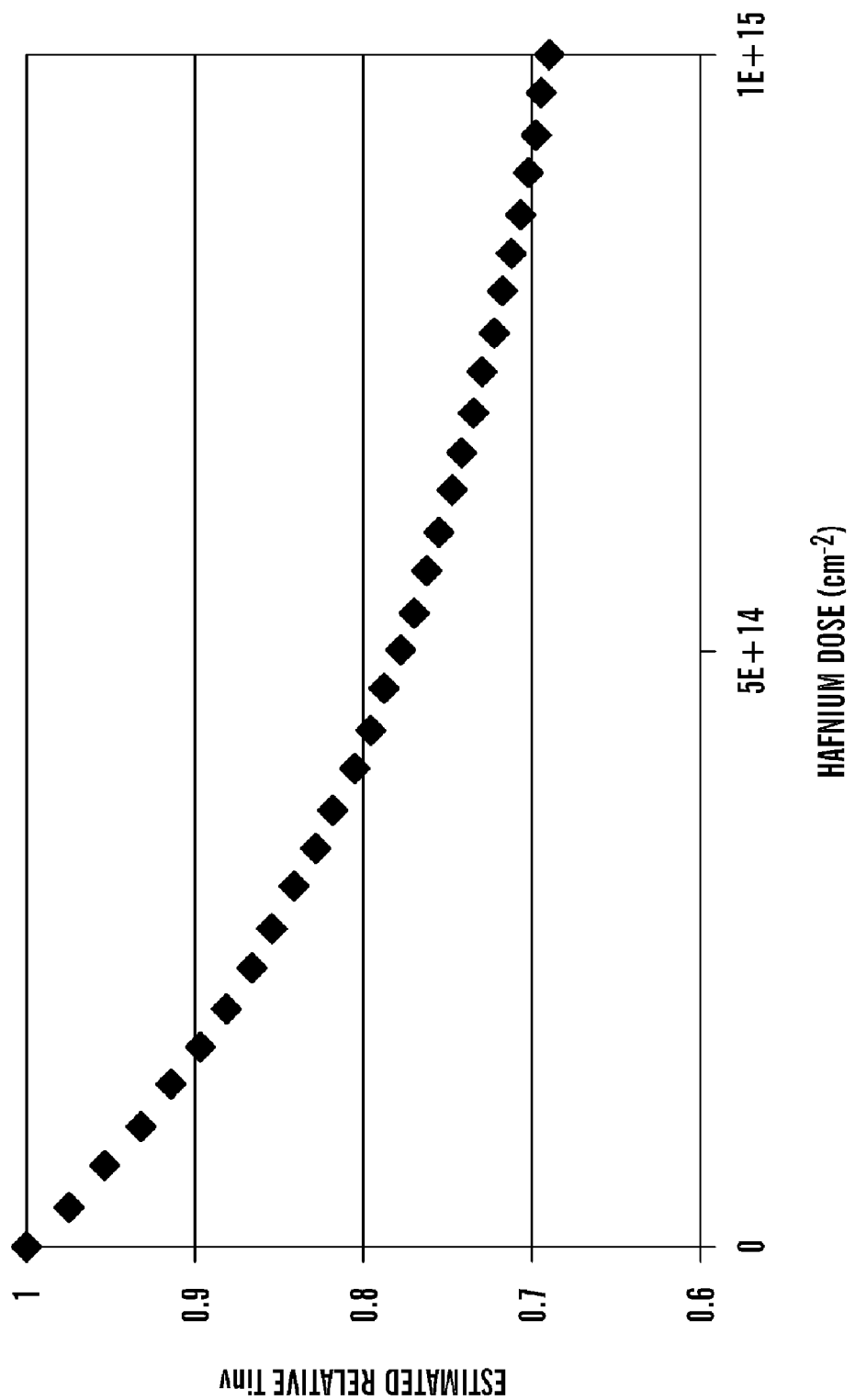

The physical thickness of $Hf_xSi_{1-x}O_2$ layer 53 can vary, but typically, has a thickness of approximately 9 Å to 20 Å, with a thickness of approximately 12 Å to 17 Å being more typical. Physical thickness and chemical composition of layer 53 can also be specified as the total surface concentration or dose of Hf atoms present in layer 53. Accordingly, for this example, layer 53 preferably contains a hafnium dose of approximately 5e13 $cm^{-2}$ to 7e14 $cm^{-2}$. Referring to FIG. 9, the relative reduction in Tinv is shown as a function of Hf dose for a typical 13 Å-thick layer 53 which yields Tinv of approximately 18 A without any Hf. A Hf dose of approximately 2e14 $cm^{-2}$ results in approximately 16 Å of Tinv.

As stated previously, layer 54 preferably contains up to 25 atomic percent of nitrogen, or, equivalently a nitrogen dose of below approximately 1e15 cm−2. Accordingly, layer 53 comprises a HfSiON layer with the same preferred low dose of Hf atoms and a preferred nitrogen dose of less than approximately 1e15 cm−2.

While the examples given are for an Hf-based layer 53, other transitional metal atoms are equally useful. Specifically, in the case of titanium, the polarizability of Ti—O bond is about 3 times higher than that of Hf—O bond leading to even smaller metal dose in layer 53 per given Tinv. Hence, the preferred dose of Ti in layer 53 is from approximately 3e13 cm−2 to 2e14 cm−2.

Subsequent processing steps are directed to complete the inventive CMOS gate structure by forming a suitable gate electrode. Formation of the gate electrode can be accomplished in several different ways.

Figure 6:
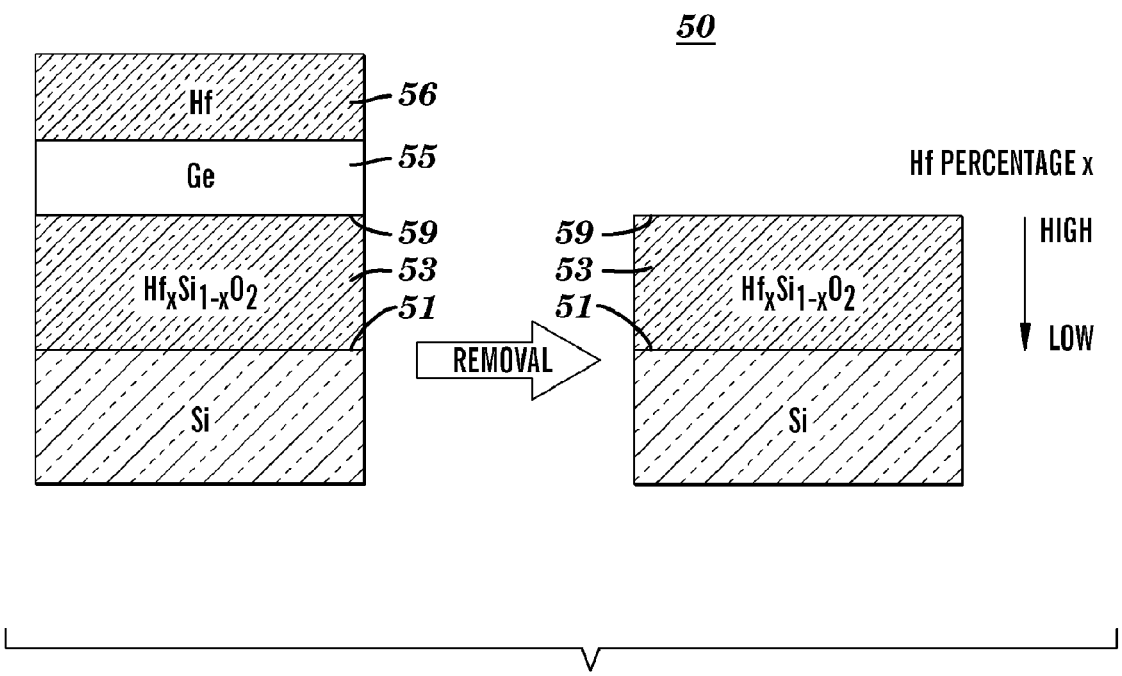
FIG. 6 illustrates the removal of the excess metal source and buffer layers after the anneal step according to a first embodiment of the present invention.

For example, in a first embodiment as illustrated in FIG. 6, the source of metal atoms 56 and the diffusion-controlling buffer layer 55 are selectively removed after the anneal step without damaging the gate dielectric, and then, a different gate electrode is formed by conventional processes. Specifically, the source of Hf atoms 56 can be removed by using a wet chemistry such as concentrated HF solution or aqua regia or by reactive ion etching with large physical component (sputtering). In both cases, the gate dielectric is protected by buffer layer 55. The metal-based buffer layer 55 can then be selectively removed with respect to the gate dielectric 53 in a solution of sulfuric acid. Alternatively, a germanium-based buffer layer can be selectively removed using a hydrogen peroxide solution.

Figure 7:
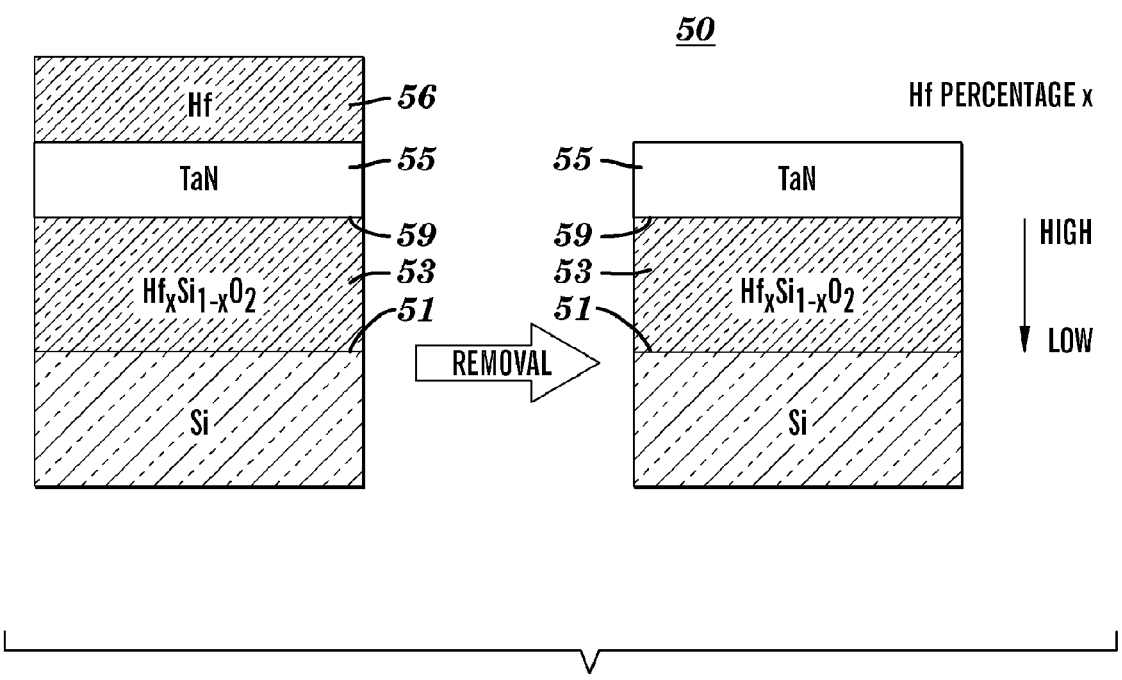
FIG. 7 illustrates the removal of the metal source layer only and using the buffer layer as a gate electrode according to a second embodiment of the present invention.

Alternatively, in a second embodiment as illustrated in FIG. 7, only the source of metal atoms 56 is selectively removed after the anneal step, while buffer layer 55 is kept as the gate electrode. In this embodiment, buffer layer 55 is selected to yield a correct work function of the resultant gate electrode. Buffer layer 55 can comprise various elemental metals and metallic compounds (e.g. silicides, nitrides, borides, and carbides), such as TaN or TiN.

Figure 8:
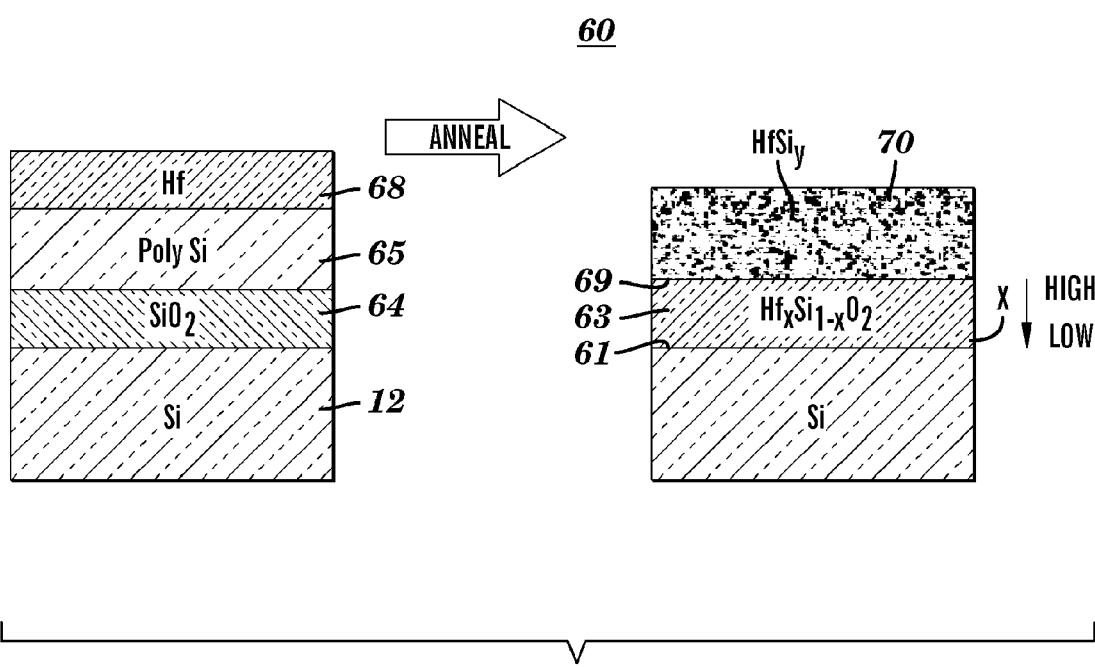
FIG. 8 illustrates an exemplary method of forming a novel gate stack structure according to a third embodiment of the present invention; and, FIG. 9 illustrates a graphic diagram plotting Tinv as a function of Hafnium dose.

Alternatively, in a third embodiment, the diffusion-controlling layer and the metal atom source are advantageously selected in such a way that their combined structure after annealing is suitable for use as a CMOS gate electrode. In one example, the buffer layer is a silicon-containing layer such as polysilicon (Poly Si). This embodiment is illustrated in FIG. 8, which illustrates a method of forming the novel gate stack structure 60 according to the second gate electrode embodiment of the present invention. Structure 60 comprises metal layer 68, e.g., Hf, deposited by a deposition process on a Si-containing material layer such as polysilicon layer (Poly Si) 65 which is formed on an ultra-thin gate dielectric 64, e.g., $SiO_2$, which is formed on a surface of a semiconductor substrate 12. The physical thickness of Hf layer 68, poly Si layer 65 and SiO2 layer 64 may vary, but typically, Hf layer 68 has a thickness of approximately 40 nm to 100 nm, poly Si layer 65 has a thickness of approximately 20 nm to 200 nm, and SiO$_2$ layer 64 has a thickness of approximately 0.5 nm to 3 nm. It should be understood that, according to the third embodiment of the invention, the metal material layers are not limited to Hf only, and that other metals such as Ti, Zr, or La are additionally applicable. According to the invention, as depicted in FIG. 8, the stack comprising metal (Hf) layer 68, poly Si layer 65 and dielectric layer 64 is then annealed at a temperature ranging from approximately 300° C. to 1100° C. to result in the simultaneous formation of a gate stack structure comprising a top HfSi$_y$ layer 70 and an underlying Hf$_x$Si$_{1-x}$O$_2$ layer 63, underlying layer 63 having a gradual Hf concentration (high Hf concentration at upper region 69 and low Hf concentration at lower region 61). Further, during anneal, the metal material diffuses through poly Si and the diffusion tails to convert some of the base oxide, e.g., SiO$_2$, into silicate. Thus, a high-k and FUSI are formed at the same time with the metal diffusing though poly Si into the base oxide, e.g., SiO$_2$, to form high-k silicate layer. By doing this, the nucleation problem of CVD HfSiO is eliminated, and thus, an ultra-thin HfSiO stack is achievable. Advantages are that gate stack structure 60 is fully silicided (FUSI), thus resulting in an approximate reduction of 3~4 A of Tinv due to elimination of poly depletion; a very thin Hf$_x$Si$_{1-x}$O$_2$ layer is formed further reducing Tinv; and higher mobility is achieved while maintaining high average dielectric constant at the same time.

In accordance with the third embodiment of the present invention, the physical thicknesses of top HfSi$_y$ layer 70, where y can range from 1 to 3, and Hf$_x$Si$_{1-x}$O$_2$ layer 63 may vary, but typically, HfSi$_y$ layer 70 has a thickness of approximately 20 nm to 300 nm, with a thickness of approximately 40 nm to 100 nm being more typical. The thickness, i.e., height, of the Hf$_x$Si$_{1-x}$O$_2$ layer 63 is approximately 0.5 nm to 5 nm, with a thickness of approximately 1 nm to 3 nm being more typical.

The present invention thus presents a new method of forming Hf$_x$Si$_{1-x}$O$_2$ by depositing metal on poly Si and annealing to form a FUSI and Hf$_x$Si$_{1-x}$O$_2$ at the same time. In accordance with the present invention, the advantages of the process shown an described in accordance with the third embodiment of the invention in FIG. 8 is the formation of a FUSI (fully silicided) gate resulting in an additional 3~4 A Tinv reduction, the formation of a very thin Hf$_x$Si$_{1-x}$O$_2$ film, reducing Tinv. The fact that metal layer 68 is not adjacent to the dielectric/substrate interface results in higher mobility while maintaining high average dielectric constant.

Of the various combinations and embodiments described above, a particular preferred CMOS structure of the present invention is one in which the high k gate dielectric layer 53 (FIG. 5) and layer 63 (FIG. 8) is comprised of Hf$_x$Si$_{1-x}$O$_2$ (hafnium silicate) or, alternatively, hafnium silicon oxynitride. The Hf$_x$Si$_{1-x}$O$_2$ dielectric layer having a high-k dielectric and formed in accordance with the principles of the invention is particularly promising for use in MOS device gate structures. Other variations and permutations of the particularly preferred structure and materials are also contemplated herein and should not be excluded.

A combination of the aforementioned embodiments can be applied to on one circuit, where one embodiment can be used to form nFET devices while another embodiment can be used to form pFET devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor structure comprising the steps of:
    a) forming a layer of a dielectric material upon a semiconductor substrate;
    b) forming a diffusion-controlled buffer layer atop said dielectric material layer;
    c) forming a layer of a metal-containing material atop said buffer layer whereby a stack is formed; and
    d) annealing said stack whereby metal atoms from said metal-containing material layer are diffused through said buffer layer into said dielectric material layer, whereby a high k gate dielectric layer is formed atop said semiconductor structure.

2. The method according to claim 1 wherein said metal of said metal-containing layer is Hf, Ti, Zr or La.

3. The method of claim 2 wherein said high k gate dielectric layer is Hf$_x$Si$_{1-x}$O$_2$, where x is 0.03 to 0.3.

4. The method of claim 1 wherein said dielectric material of said dielectric material layer comprises an oxide, a nitride or an oxynitride material.

5. The method of claim 1 wherein said buffer layer comprises a layer of a sacrificial material selected from the group consisting of inert semiconductors and inert metals.

6. The method of claim 5 wherein said sacrificial inert semiconductor is germanium and said sacrificial inert metal is selected from the group consisting of tungsten, molybdenum, tungsten nitride and molybdenum nitride.

7. The method of claim 1 wherein said buffer layer comprises a layer that yields a gate electrode which comprises an elemental metal or a metallic compound inert to a metal selected from the group consisting of Hf, Ti, Zr and La.

8. The method of claim 7 wherein said metal compound inert to said metal selected from the group consisting of Hf, Ti, Zr and La is selected from the group consisting of WN and TaN.

9. The method of claim 1 wherein said buffer layer comprises a layer of a material which reacts with said metal of said metal-containing material to form a gate electrode.

10. The method of claim 9 wherein said buffer layer of a material which reacts with said metal of said metal containing material to form said gate electrode comprises silicon.

11. The method of claim 1 wherein said high k dielectric layer is characterized by a higher metal concentration toward an upper region of said high k gate dielectric layer and a lower metal concentration toward a lower region of said high k gate dielectric layer.

12. A semiconductor structure comprising a semiconductor substrate and a gate dielectric layer disposed atop said semiconductor substrate, said gate dielectric layer comprising a metal compound having the formula M$_x$Si$_{1-x}$O$_2$, where M is Hf, Ti, Zr or La; and x is 0.03 to 0.3, said gate dielectric layer having a thickness of between about 0.5 am and about 2 nm and a surface concentration of metal atoms not exceeding 7e14 cm$^{-2}$.

13. The semiconductor structure of claim 12, wherein said semiconductor substrate comprises Si, Ge, SiGe, SiGeC, Ga, GaAs, InAs, InP, other III/V or II/VI compound semiconductors, organic semiconductors, layered semiconductors, silicon-on-insulator, or silicon germanium-on-insulator.

14. The semiconductor structure of claim 12, wherein said metal atoms comprise Hf atoms and said surface concentration ranges from approximately 5e13 cm$^{-2}$ to approximately 7e14 cm$^{-2}$.

15. The semiconductor structure of claim 12, wherein said metal atoms comprise Ti atoms and said surface concentration ranges from approximately 3e13 cm$^{-2}$ to approximately 2e14 cm$^{-2}$.

16. The semiconductor structure of claim 12, wherein said gate dielectric layer has a higher metal concentration toward an upper region of said gate dielectric layer and a lower metal concentration toward a lower region of said gate dielectric layer.

17. A semiconductor structure comprising a semiconductor substrate and a high k gate dielectric layer disposed atop said semiconductor substrate, said high k gate dielectric layer comprising a metal-containing material having a higher metal concentration toward an upper region of said high k gate dielectric layer and a lower metal concentration toward a lower region of said high k gate dielectric layer.

18. The semiconductor structure according to claim 17 including a buffer layer disposed atop said high k gate dielectric layer.

19. The semiconductor structure according to claim 18 wherein said buffer layer is selected from the group consisting of WN and TaN.

20. The semiconductor structure according to claim 18 wherein said buffer layer is silicon.

* * * * *